United States Patent
Hsu

(10) Patent No.: US 7,232,959 B2
(45) Date of Patent: Jun. 19, 2007

(54) PRINTED CIRCUIT BOARD AND INTERLEAVING ROUTING SCENARIO THEREOF

(75) Inventor: Shou-Kuo Hsu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 100 days.

(21) Appl. No.: 10/957,178

(22) Filed: Sep. 30, 2004

(65) Prior Publication Data

US 2005/0067187 A1    Mar. 31, 2005

(30) Foreign Application Priority Data

Sep. 30, 2003    (TW) ................ 92126964 A

(51) Int. Cl.
*H01R 12/04* (2006.01)
(52) U.S. Cl. ............. 174/261; 174/113 R; 174/255; 333/33
(58) Field of Classification Search ........ 361/750–818; 174/261, 262, 36, 113 R; 333/4, 5
See application file for complete search history.

(56) References Cited

U.S. PATENT DOCUMENTS

| 6,486,405 B2 | 11/2002 | Lin |
| 2003/0147375 A1* | 8/2003 | Goergen et al. |
| 2005/0099240 A1* | 5/2005 | Lin et al. |

FOREIGN PATENT DOCUMENTS

JP      2001-015925     *   1/2001

* cited by examiner

*Primary Examiner*—Tuan Dinh
*Assistant Examiner*—Yuriy Semenenko
(74) *Attorney, Agent, or Firm*—Wei Te Chung

(57) ABSTRACT

A printed circuit board and a routing scenario thereof are disclosed. The printed circuit board includes three dielectric layers, two signal layers and several differential pairs. Some differential pairs are disposed in one signal layer, while some differential pairs are interleavingly disposed in the adjacent other signal layer. The differential pairs in one signal layer carries signals that flows to one direction, while the differential pairs in the adjacent signal layer carries signals that flows to an opposite direction. Under such a routing scenario, the crosstalk between differential pairs in adjacent signal layers may be reduced.

1 Claim, 1 Drawing Sheet

PRINTED CIRCUIT BOARD AND INTERLEAVING ROUTING SCENARIO THEREOF

BACKGROUND OF THE INVENTION

1. Field of the Invention

The present invention relates generally to a printed circuit board and a routing scenario thereof, and more particularly to a printed circuit board and an interleaving routing scenario thereof for reducing the crosstalk between signal traces in the printed circuit board, and for saving the routing real estate.

2. Prior Art

The advancement of electronic industry demands more and more electronic components to be integrated on a single printed circuit board. Besides, smaller and smaller size of the printed circuit board is in need for smaller and smaller electronic products. As a result, a printed circuit board with a limited area requires disposing denser and denser routing scenario thereon. This narrows the spacing between signal traces.

Conventionally, a printed circuit board adopts a right-angle routing scenario, a 45 degrees routing scenario, a differential routing scenario or a zigzag routing scenario. In applications of high-speed design, one usually employs the differential routing scenario.

Referring to FIG. 1, the differential routing scenario of the conventional printed circuit board in stripline geometry is illustrated. As shown, the printed circuit board 100 comprises a first ground plate 110, a first dielectric layer 120, a signal layer 130, a second dielectric layer 140, and a second ground plate 150, wherein a plurality of differential pairs, such as a first differential pair 131 and a second differential pair 134, is disposed within the signal layer 130. The signal layer 130 is formed between the first dielectric layer 120 and the second dielectric layer 140. The first ground plate 110 is formed above the first dielectric layer 120, while the second ground plate 150 is formed beneath the second dielectric layer 140. The first dielectric layer 120 and the second dielectric layer 140 is made of either a homogeneous dielectric material or a non-homogeneous dielectric material. Data signals on the first differential pair 131 and the first differential pair 134 are directed and flowed to the same direction.

However, the conventional differential routing scenario, illustrated in FIG. 1, is disadvantageous in that the differential pairs are dispose layer. The denser the differential pairs are disposed in the same signal layer, the higher the crosstalk between differential pairs is increased. Besides, the denser the differential pairs are disposed in the same signal layer, the more likely the electromagnetic interference between differential pairs would incur. These would largely reduce the performance of the entire printed circuit board system. Therefore, there is a need for a differential routing scenario that may prevent the crosstalk and the electromagnetic interference between differential pairs from happening.

SUMMARY OF THE INVENTION

One objective of the present invention is to provide a printed circuit board and an interleaving routing scenario thereof for reducing the crosstalk between differential pairs and for saving the routing real estate.

In order to achieve the above and other objectives, the present invention provides a printed circuit board comprising a plurality of dielectric layers, a plurality of signal layers, and a plurality of differential pairs. Each signal layer is sandwiched by two dielectric layers. Each dielectric layer has its own dielectric constant. The differential pairs are interleavingly disposed in the signal layers. The differential pairs further comprise a first signal trace and a second signal trace. Each differential pair carries a signal flowing toward one direction, while the signal in the differential pairs disposed in the same signal layer flow to the same direction. The signals in the differential pairs disposed in adjacent signal layers flows to opposite directions. In such a routing scenario, the crosstalk between differential pairs disposed in adjacent signal layers is largely reduced. Meanwhile, the routing real estate is saved.

BRIEF DESCRIPTION OF THE DRAWINGS

The present invention is better understood by referring to the detailed description of the preferred embodiment taken in conjunction with the drawings, in which like reference numerals denote like elements, and wherein.

DETAILED DESCRIPTION OF THE INVENTION

Figure 1:
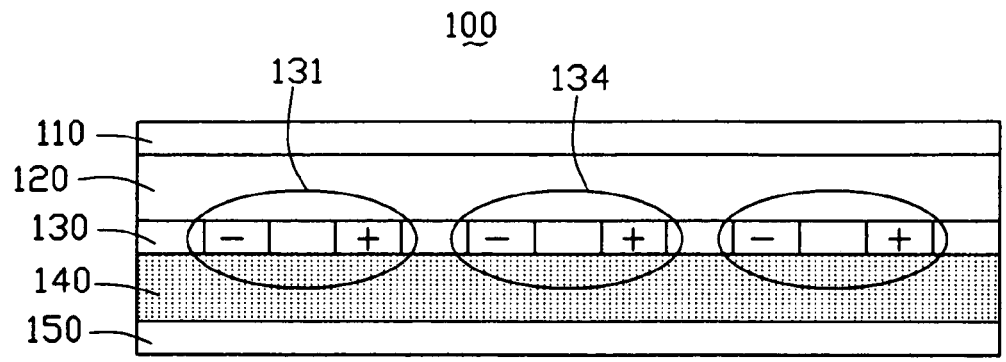
FIG. 1 is a cross-sectional view of a printed circuit board illustrating a conventional routing scenario.
Figure 2:
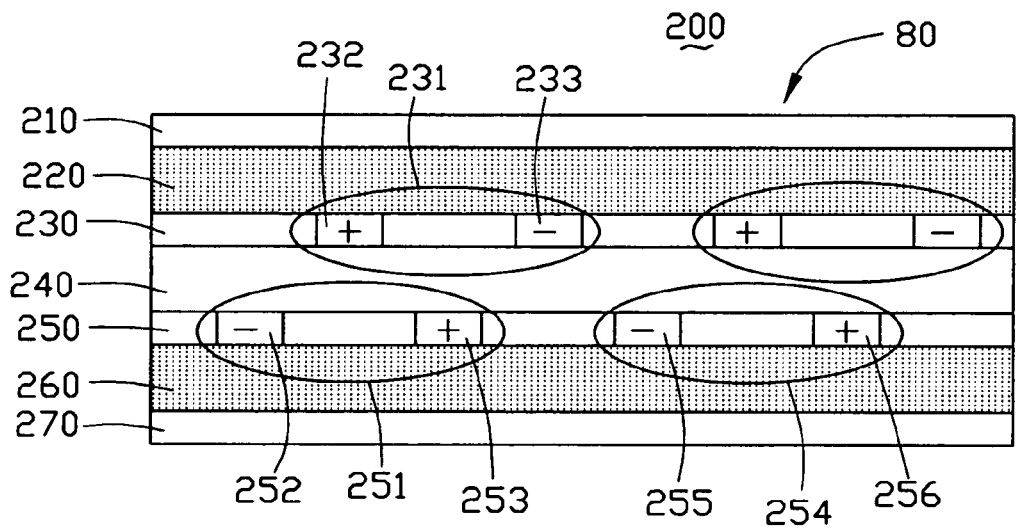
FIG. 2 is a cross-sectional view of a printed circuit board illustrating a interleaving routing scenario, in accordance with the present invention.

Referring to FIG. 2, the differential routing scenario of a printed circuit board 200 of the present invention in stripline geometry is illustrated. The printed circuit board 200 comprises a first ground plane 210, a first dielectric layer 220, a first signal layer 230, a second dielectric layer 240, a second signal layer 250, a third dielectric layer 260, and a second ground plane 270. In one particular embodiment of the present invention, the dielectric constants of the first dielectric layer 220, the second dielectric layer 240 and the third dielectric layer 260 are the same, i.e. homogeneous dielectric layers; the thickness of the first ground plane 210 and the second ground plane 270 is 0.7 mils; the thickness of the first dielectric layer 220 and the third dielectric layer 260 is four mils; the thickness of the second dielectric layer 240 is twelve mils; and the thickness of the first signal layer 230 and the second signal layer 250 is 0.7 mils.

A plurality of differential pairs is disposed in the first signal layer 230 and the second signal layer 250. For example, a first differential pair 231 having a first signal trace 232 and a second signal trace 233 separated by a predetermined spacing is disposed in the first signal layer 230, while a second differential pair 251 having a third signal trace 252 and a fourth signal trace 253 separated by a predetermined spacing and a third differential pair 254 having a fifth signal trace 255 and a sixth signal trace 256 separated by a predetermined spacing are disposed in the second signal layer 250. In one particular embodiment of the present invention, the width of the signal traces, such as the first signal trace 232, the second signal trace 233 etc., is seven mils; the spacing between the first signal trace 232 and the second signal trace 233, i.e. from the right hand side of the first signal trace 232 to the left hand side of the second signal trace 233, is eleven mils; the spacing between the second differential pair 251 and the third differential pair 254, i.e. from the right hand side of the fourth signal trace 253 to the left hand side of the fifth signal trace 255, is sixteen mils. As shown in FIG. 2, the differential pairs in the first signal layer 230 and in the adjacent second signal layer 250 follow the interleaving routing scenario, that is data in the interleavingly disposed different pairs flows in opposite directions. For example, providing that data in the first differential pair 231 flows toward one paper, data in the second differential pair 251 then flows toward an opposite direction.

Referring again to FIG. 2, the first differential pair 231 having a first signal trace 232 and a second signal trace 233 and the second differential pair 251 having a third signal trace 252 and a fourth signal trace 253 may be regarded as either an "aggressor" or a "victim". Take, for example, the second differential pair 251 being an aggressor and the first differential pair 231 being a victim. Suppose that data in the first signal trace 232 is in its zero phase, while data in the third signal trace 252 and in the fourth signal trace 253 is in its negative phase and positive phase, respectively. Since the distance between the first signal trace 232 and the third signal trace 252 and the distance between the first signal trace 232 and the fourth signal trace 253 are the same, crosstalk on the first signal trace 232 induced by the third signal trace 252 cancels that induced by the fourth signal trace 253. Similarly, suppose one takes the first differential pair 231 being a victim and the second differential pair 251 being an aggressor, crosstalk on the fourth signal trace 253 induced by the first signal trace 232 cancels that induced by the second signal trace 233. Therefore, crosstalk in such a routing scenario is largely reduced. Since the routing scenario of the printed circuit board in the present invention disposes differential pairs interleavingly in adjacent signal layers, the routing real estate of the printed circuit board of the present invention is also saved.

Figure 3:
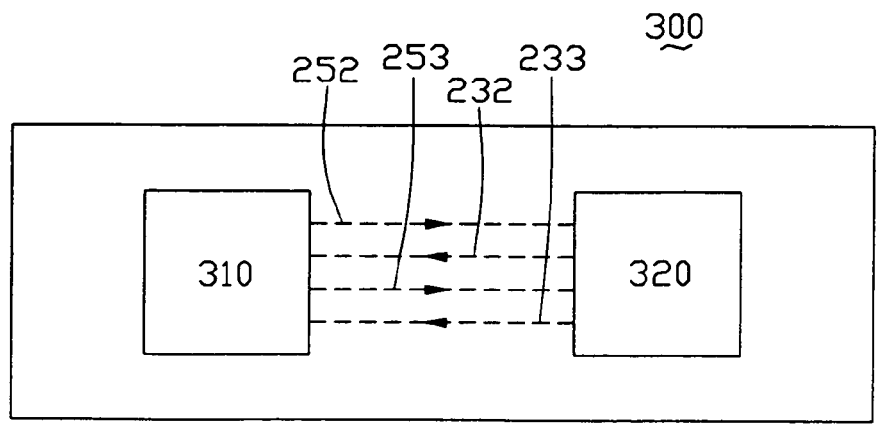
FIG. 3 is a top view of a printed circuit board illustrating a printed circuit board having a plurality of electronic components coupled with each other by means of a routing scenario, in accordance with the present invention.

Referring now to FIG. 3, a top view of a printed circuit board 300 having a plurality of electronic components, such as a first electronic component 310 and a second electronic component 320, coupled with each other by means of the routing scenario of the present invention is illustrated. As shown, the first electronic component 310 is couple to the second electronic component 320 through a plurality of signal traces, such as a first signal trace 232, a second signal trace 233, a third signal trace 252 and a fourth signal trace 253. The first signal trace 232 and the second signal trace 233 are disposed in one signal layer, while the third signal trace 252 and the fourth signal trace 253 are disposed in another signal layer. The first signal trace 232 and the second signal trace 233 forms the first differential pair 231 that is disposed in the first signal layer 230 as shown in FIG. 2. The third signal trace 252 and the fourth signal trace 253 forms the second differential pair 251 that is disposed in the second signal layer 250 as shown in FIG. 2. Similarly, by following such a routing scenario, the crosstalk between the signal traces as shown in FIG. 3 is thus largely reduced.

Although the above discussion discloses the best mode of carrying out the present invention, there are many other possible embodiments. Any person having ordinary skill in the art may find various equivalent modifications or alterations of the present invention, in light of the above disclosures. Therefore, all such modifications or alterations of the present invention without substantially departing from the subject matter as set forth in the following claims is considered within the spirit and scope of the present invention.

What is claimed is:

1. A printed circuit board, comprising:
   first and second signal layers sandwiching a dielectric layer therebetween in a vertical direction;
   a first differential pair including a first signal trace and a second signal trace disposed in the first signal layer; and
   a second differential pair including a third signal trace and a fourth signal trace disposed in the second signal layer;
   wherein the distance between the first signal trace and the third signal trace is equal to the distance between the first signal trace and the fourth signal trace, and the distance between the fourth signal trace and the first signal trace is equal to the distance between the fourth signal trace and the second signal trace.

* * * * *